United States Patent [19]

Riley, Jr.

[11] 4,234,929
[45] Nov. 18, 1980

[54] CONTROL DEVICE FOR A PHASE LOCK LOOP VERNIER FREQUENCY SYNTHESIZER

[75] Inventor: William J. Riley, Jr., Rochester, N.Y.

[73] Assignee: Harris Corporation, Melbourne, Fla.

[21] Appl. No.: 78,210

[22] Filed: Sep. 24, 1979

[51] Int. Cl.³ .............................................. G06F 7/68
[52] U.S. Cl. .................................. 364/701; 307/271; 328/15; 328/39; 364/703
[58] Field of Search .................. 364/701, 703; 328/15, 328/39, 55, 133, 140; 307/210, 262, 271

[56] References Cited

U.S. PATENT DOCUMENTS

| | | | |
|---|---|---|---|
| 3,353,104 | 11/1967 | Loposer | 328/39 |
| 3,769,597 | 10/1973 | Mayer | 328/15 X |
| 3,882,403 | 5/1975 | Gerken | 307/271 X |
| 3,913,028 | 10/1975 | Bosselaers | 307/271 X |

Primary Examiner—Jerry Smith
Attorney, Agent, or Firm—L. Lawton Rogers, III

[57] ABSTRACT

Disclosed is a device for controlling the selection of divider factors in a vernier frequency synthesizer employing a pair of phase lock loops coupled through a mixer to supply a synthesized output signal frequency. The control device generates a pair of divider factors for the respective programmable dividers of the two loops which will generate a particular synthesized output frequency and avoids predetermined divider factors such as those which are not processable by programmed dividers of the loops or which would generate frequencies within the loops causing spurious mixing products with other signals. The control device preferably takes the form of a microprocessor.

14 Claims, 8 Drawing Figures

CONTROL DEVICE FOR A PHASE LOCK LOOP VERNIER FREQUENCY SYNTHESIZER

BACKGROUND OF THE INVENTION

This invention relates to the field of frequency synthesis and particularly to indirect frequency synthesizers which use a vernier technique to produce an output frequency in steps which are equal to the frequency difference between the reference signals of two phase loops which are coupled together through a mixer.

Frequency synthesizers using phase lock loops are well known and their technology well developed. The output frequency of a single loop is generally equal to N times the frequency of the loop reference signal, where N is the divider factor of a programmable digital frequency divider within the loop. The loop output frequency can, therefore, be varied in steps equal to the frequency of the reference signal by changing the value of N.

The most serious fundamental limitation of the single loop approach is that high resolution (small frequency step size) requires a low reference frequency which in turn restricts the allowable bandwidth of the loop. This causes a slow loop lockup and poor suppression of reference modulations within the loop.

The vernier technique which uses two phase lock loops coupled through a mixer is an attractive way to overcome the limitations of the single loop frequency synthesizer, since high resolution can be obtained while maintaining relatively high frequencies in the respective loop reference signals. While there are other multi-loop arrangements which offer similar advantages, the vernier approach is fundamentally the least complex.

The most serious disadvantages of the vernier technique is frequency divider programming complexity, since the two divider factors for the respective loop programmable frequency dividers are not simply related to the desired output frequency. The need for a complicated programming logic to generate required divider factors for the programmable frequency dividers of the two loops has limited the past application of vernier synthesis. This invention provides a control device that operates in response to a frequency selection device to select combinations of divider factors for the programmable frequency dividers of the loops which will yield a desired synthesized output frequency.

In addition, the use of multi-loop synthesis techniques has been hampered by the fact that for certain applications internal loop frequencies are generated which cause spurious mixing products with other signals within or without the frequency synthesizer, thereby requiring the need for bulky filtering, isolation and shielding. The invention overcomes this problem by making use of the fact that with the vernier technique different combinations of divider factors for the coupled phase lock loops can yield the same synthesized output frequency. The control device is preset with divider factor selection criteria which are compatible with desired loop operating characteristics, e.g., internal loop frequencies.

The invention also permits more widespread use of programmable frequency dividers using variable modulus prescalers in the coupled phase lock loops of a vernier frequency synthesizer as unallowed divider factors inherent in such programmable frequency dividers can be avoided by appropriate divider factor selection criteria. The invention can also enhance the spectral purity of the output signal of a vernier frequency synthesizer by avoiding divider factor combinations which produce internal loop frequencies which would result in unfavorable spurious mixing products. The invention also allows greater flexibility in the overall construction of the vernier synthesizer, as divider factors and, therefore internal frequencies may be chosen to favor other considerations, such as loop tuning range, gain compensation, loop signal modulatability or other loop parameters. Channel spacing may also be varied without major impact in other parameters.

The control device and its associated preset divider factor selection criteria can be constructed from conventional arithmetic storage, gating and other logic devices, or from programmed memory devices, but is preferably constructed in the form of a microprocessor which is programmed with the divider factor selection criteria for the two loops. The use of a microprocessor simplifies the control device hardware, improves the performance of the vernier frequency synthesizer, and permits easy adaptation of a basic vernier frequency synthesizing loop configuration to a multitude of different frequency synthesis environments.

The use of a micrprocessor to select divider factors particularly permits simplified programming of the basic synthesizer output frequency. Divisor data can be generated in any radix system from a variety of controls or memories and the microprocessor can also calculate other data such as IF (intermediate frequency) offset or channel numbers.

These and other objects and advantages of the invention will become more apparent from the following detailed description of the invention taken in conjunction with the accompanying drawings.

DETAILED DESCRIPTION OF THE INVENTION

Figure 1:
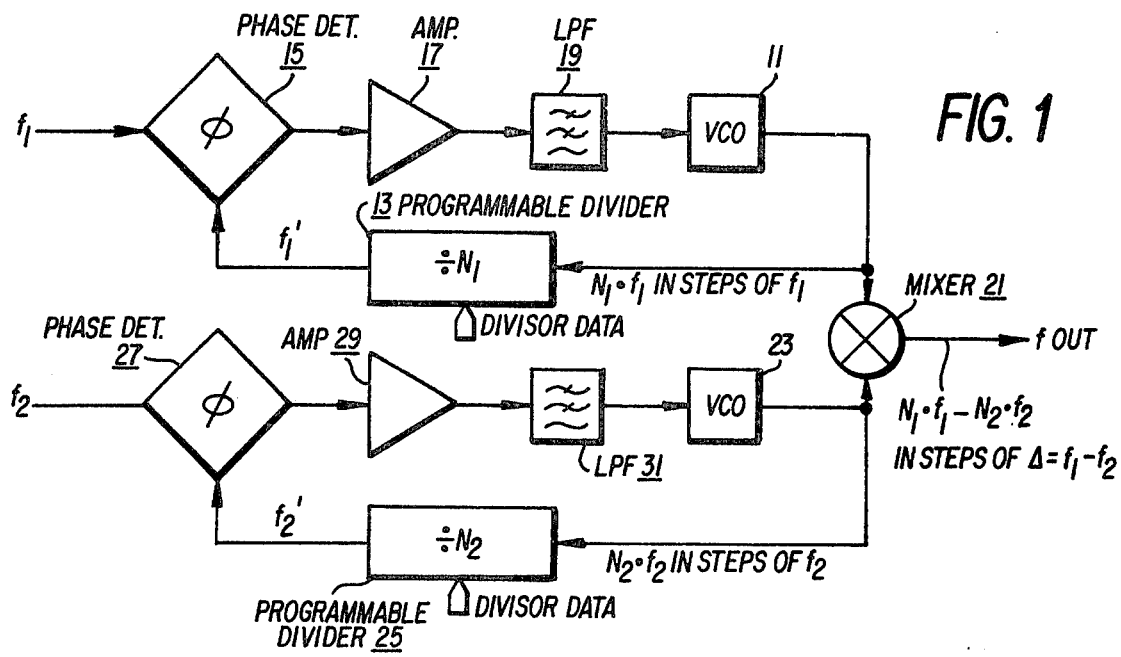
FIG. 1 shows a block diagram of a basic vernier frequency synthesizer consisting of two mixer coupled phase lock loops.

FIG. 1 illustrates in block diagram a basic vernier frequency synthesizer consisting of two simple phase lock loops. A first loop includes the serial loop connection of a voltage control oscillator (VCO) 11, a programmable frequency divider 13 having a divider factor $N_1$, a phase detector 15, an amplifier 17, and a low pass filter 19. The frequency output of VCO 11 is controlled in accordance with a phase comparison between the frequency of a loop input reference signal $f_1$ applied to one input of the phase comparator 15 and the frequency of output signal $f_1'$ from programmable frequency divider 13 applied to another input of phase comparator 15 and is fed to a first input of a signal mixer 21. The second loop is constructed likewise and includes the serial loop connection of a voltage control oscillator 23, a programmable frequency divider 25 having a divider factor $N_2$, a phase detector 27, an amplifier 29, and a low pass filter 31. Phase detector 27 compares the frequency of a reference signal $f_2$ with the frequency of signal $f_2'$ received from the programmable frequency divider 25. The output signal of voltage control oscillator 23 is fed to a second input of mixer 21. When the loops are both locked, $f_1 = f_1'$ and $f_2 = f_2'$.

Figure 3:
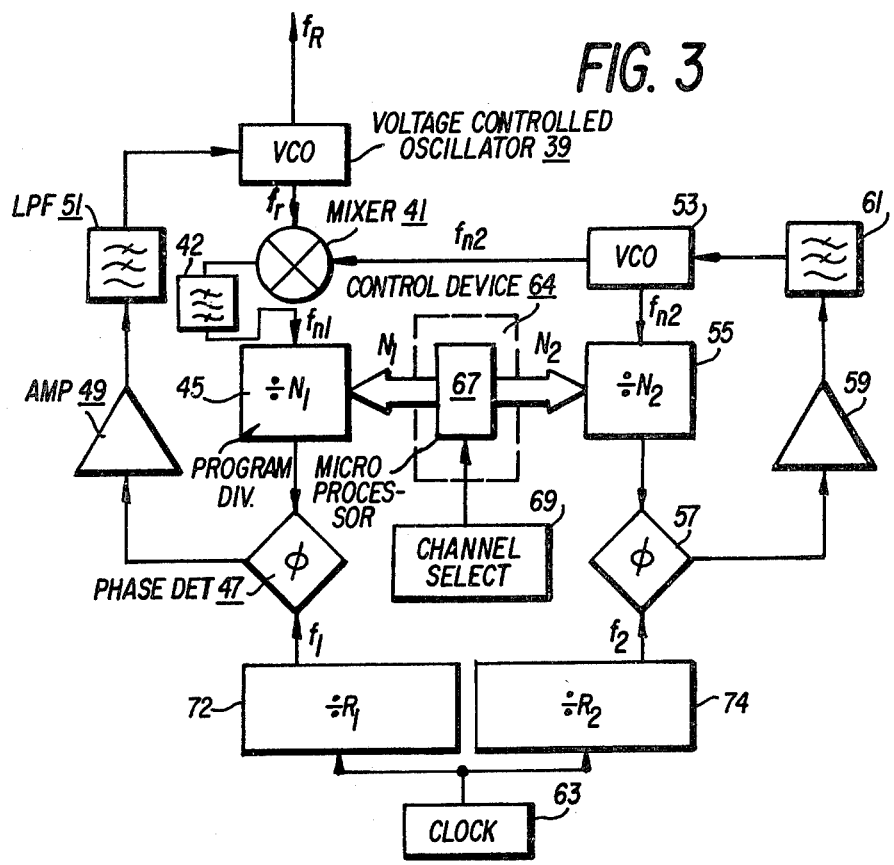
FIG. 3 illustrates in block diagram form a preferred embodiment of the invention using a microprocessor as a programmable frequency divider control device.

The output signal of mixer 21 has a synthesized frequency which is determined by divider factors $N_1$ and $N_2$ of the coupled loops. The mixer may be located after the loops, as illustrated in FIG. 1, or within one loop, as illustrated later in FIG. 3. Providing the mixer within one loop is preferred to improve spectral purity of the output signal. Each loop produces a frequency equal to $N \cdot f_{ref}$ in steps of $f_{ref}$ (where $f_{ref}$ is respectively shown as $f_1$ and $f_2$ in FIG. 1). The overall vernier synthesizer has an output that can be varied in steps of $\Delta = f_1 - f_2$. The term "vernier" is used by analogy to a mechanical vernier caliper which has a resolution equal to the difference between the spacings of the graduations on two scales. The mixer output signal frequency is $f_{out} = N_1 \cdot f_1 - N_2 \cdot f_2$, where, as noted, $N_1$ and $N_2$ are respective divider factors for the programmable frequency dividers 13 and 25. The two reference frequencies $f_1$ and $f_2$ may be derived by a common clock source and a pair of frequency dividers as shown in FIG. 3. The minimum frequency, $f_c$, for the clock source is the least common multiple of $f_1$ and $f_2$. Generally, the reference divider factors are $R_1 = R$ and $R_2 = R + 1$ where $R = f_c/f_1$ and therefore $f_c = \Delta \cdot R(R+1)$. In this case $R = n = f_2/\Delta$ and $f_c = f_1 \cdot f_2/\Delta$.

A basic characteristic of the FIG. 1 vernier frequency synthesizer will now be described. If both $N_1$ and $N_2$ divider factors are increased by 1, the output frequency will become $(N_1+1)\cdot f_1 - (N_2+1)\cdot f_2$, and thus will increase (positively if $f_1 > f_2$) by $\Delta = f_1 - f_2$. This process can be repeated indefinitely to generate each desired frequency over a certain frequency range in increments of $\Delta$. After a number of increments, $n = f_2/\Delta$, the output frequency will become $$f_{out} = (N_1 + n)f_1 - (N_2 + n)f_2 =$$
$$N_1 \cdot f_1 - N_2 \cdot f_2 + n \cdot f_1 - n \cdot f_2 =$$
$$N_1 \cdot f_1 - N_2 \cdot f_2 + \frac{f_2 \cdot f_1}{f_1 - f_2} - \frac{f_2 \cdot f_2}{f_1 - f_2} =$$
$$N_1 \cdot f_1 - N_2 \cdot f_2 + f_2 =$$
$$N_1 \cdot f_1 - (N_2 + 1) \cdot f_2$$

As is evident, the nth increment may be generated by returning $N_1$ to its starting value and incrementing only $N_2$ by 1. This extends the analogy to the mechanical vernier caliper because of the periodic alignment between the lines on the two scales. A frequency range could thus be covered by varying $f_1$ over a range of only $(n+1)$ increments. Thus, either loop divider factor (and corresponding loop output frequency) can be nearly fixed while the other varies widely to cover a desired range. In addition, if $N_1$ is incremented by $kn$ and $N_2$ is incremented by $k(n+1)$, where $k$ is any integer and $n = f_2/\Delta$, the same synthesis output frequency is produced using different combinations of internal frequencies. A vernier synthesizer therefore has a high degree of inherent frequency programming flexibility. The invention uses this flexibility and provides a control device to select only combinations of divider factors which are consistent with specified divider factor selection criteria determined in accordance with the capabilities of the loop programmable frequency dividers and/or to avoid undesired loop operating characteristics.

Figure 2:
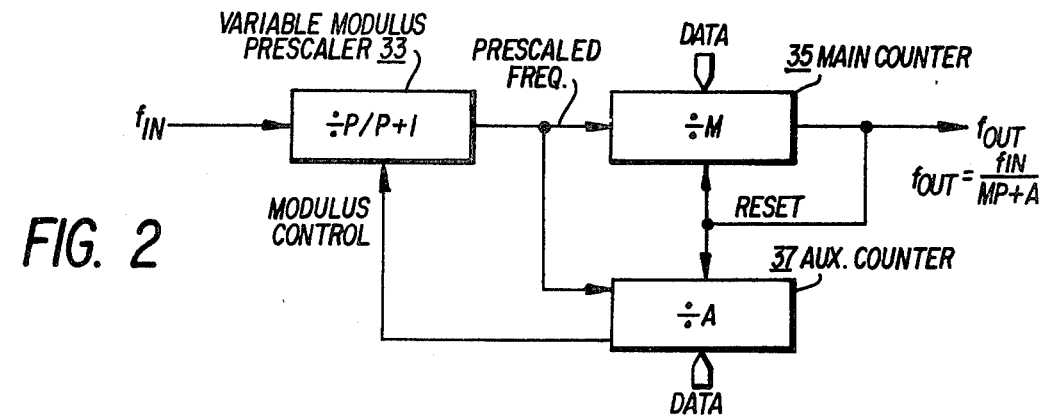
FIG. 2 shows a block diagram of a programmable frequency divider using a variable modulus prescaler which may be used in the FIG. 1 apparatus.

One of the problems solved by the appropriate selection of divider factors will now be discussed. The upper frequency range of a ÷ N phase lock loop frequency synthesizer is often limited by the speed of the programmable frequency divider therein. An effective means of high frequency programmable division uses the concept of variable modulus prescaling and a programmable frequency divider using this technique is shown in FIG. 2. A variable modulus prescaler 33 divides the frequency of an input signal $f_{in}$ by either the factor $P$ or $(P+1)$. The prescaled frequency output signal of variable modulus prescaler 33 is applied to two programmable counters, a main ÷ M counter 35 which produces the output signal $f_{out}$ and an auxiliary ÷ A counter 37 which controls the prescaler modulus. The prescaler 33 divides by $(P+1)$ for A times and then divides by P for $(M-A)$ times until the output from the M counter resets both the A and M counters. The overall division factor N for the programmable frequency divider of FIG. 2 is $N = MP + A$. Because the A counter must count up to $(P-1)$ to cover all possible values, and the value of M cannot be less than A, the minimum value N can attain is $P(P-1)$. Below this value of N there are gaps in the overall divider factors which can be used, i.e., certain divider factors for N cannot be used.

The invention overcomes this problem of non-allowable divisors in a coupled loop vernier frequency synthesizer by the use of a control device, to select and generate only divider factor combinations to produce a selected output frequency which are processable by the programmable frequency dividers. In other words, rather than using any divisor factor combinations which could generate a selected output frequency, the control device of the invention is preset with divisor selection criteria which accounts for the dividing limitations of the programmable frequency dividers of the loops. Thus, the control device only selects divider factors which will cause generation of a selected output frequency and which are processable by the programmed frequency dividers of the loops.

Another problem frequently encountered with vernier frequency synthesizers is the generation of spurious harmonic intermodulation products of the form $Af_r + Bf_{n2} = f_s$, where A and B are integers of opposite sign, in the synthesizer mixer at a level determined by the factors A and B and the characteristics of the mixer. A signal coincidence exists when a spurious component $f_s$ resides too close in frequency to the desired mixer output signal $f_{n1}$. The spectral purity of an output signal can be improved somewhat by placing the mixer within one of the loops, such as illustrated in FIG. 3 described in detail below, since many of the spurious components will then reside outside the loop bandwidth and not interfere with the control of the loop VCO. However, if the spurious component $f_s$ is very close in frequency to the mixer output, the spurious component can lie inside the loop bandwidth and modulate the VCO, thereby producing undesired signal components spaced from the desired synthesizer frequency by $\pm \epsilon = f_{n1} - f_s$, where $f_{n1}$ represents the desired mixer output and $f_s$ represents the mixer spurious component.

The spurious signal component problem may be overcome and the spectral purity of the synthesizer output signal improved with the invention by appropriate divider factor selection criteria. The loop frequencies at which the spurious problems exist are first determined and the control device is preset to avoid selection of divider factors $N_1$ and $N_2$ for the respective phase lock loops which cause generation of these loop frequencies. Thus, the divider factor combinations which will cause generation of a selected synthesized output frequency without causing generation of the undesired loop frequencies are selected and applied to the programmable frequency dividers.

Another problem with conventional vernier synthesizers is the generation frequencies within a loop which are radiated to and interfere with circuits external to the frequency synthesizer, causing their erroneous operation. This problem can also be avoided in the invention by appropriate divider factor selection by the control device.

The invention also contemplates controlling the operating characteristics of the coupled phase lock loops by presetting the control device so that it selects divider factors which are compatible with a desired loop operation, such as a loop tuning range, gain compensation required, loop signal modulatability or other loop operating parameters.

A first embodiment of the invention will now be described with particular reference to FIG. 3 which shows a microprocessor 67 used as the control device 64 for selecting divisors for the programmable frequency dividers respectively provided in the two mixer coupled phase lock loops of a vernier frequency synthesizer.

The first phase lock loop includes a voltage controlled oscillator (VCO) 39 which provides the output signal $f_R$ and an input signal corresponding thereto to an input terminal of a signal mixer 41, a programmable frequency divider 45 having an adjustable divider factor $N_1$ and an input terminal connected to receive the output from a bandpass filter 42 connected to mixer 41 and for providing an output signal which is applied to one input terminal of phase detector 47, an amplifier 49 having an input terminal connected to receive the output signal of phase detector 47, and a low pass filter 51 having an input terminal connected to receive the output signal of amplifier 49 and providing an output signal which is applied to VCO 39 to control its output frequency $f_R$. Phase detector 47 has another input terminal connected to receive a reference signal of frequency $f_1$ derived from a frequency divider 72, which in turn is connected to a clock source 63.

The second phase lock loop includes a VCO 53 which provides an output signal to another input terminal of mixer 41, a programmable frequency divider 55 having an adjustable divider factor $N_2$ and an input terminal connected to receive the VCO 53 output signal for providing an output signal which is applied to one input terminal of phase detector 57, an amplifier 59 having an input terminal connected to receive the output signal of phase detector 57, and a low pass filter 61 having an input terminal connected to receive the output signal of amplifier 59 and providing output signal which is applied to VCO 53 to control its output frequency. Phase detector 57 has another input terminal connected to receive a reference signal of frequency $f_2$ derived from frequency divider 74. The reference signal frequencies $f_1$ and $f_2$ differ from one another by an amount corresponding to the spacing between synthesized output frequencies ($\Delta = f_1 - f_2$).

The microprocessor 67 is connected with a channel selection device 69 which may take the form of a keyboard, rotary switches or other suitable frequency selection mechanism. The microprocessor receives channel select data from selection device 69 and applies output data signals to the programmable frequency dividers 45, 55 corresponding to the divider factors $N_1$ and $N_2$ necessary to generate a selected output frequency.

The microprocessor selects divider factors $N_1$ and $N_2$ for respective programmable dividers 45 and 55 in accordance with predetermined selection criteria so as to avoid selection of divider factors which cannot be processed by the programmable dividers 45 and 55 or which are undesired because of one or more loop operating characteristics which would follow from their use. The predetermined selection criteria can be easily programmed into the microprocessor as a processing routine and can be easily changed to meet different needs.

Figure 4:
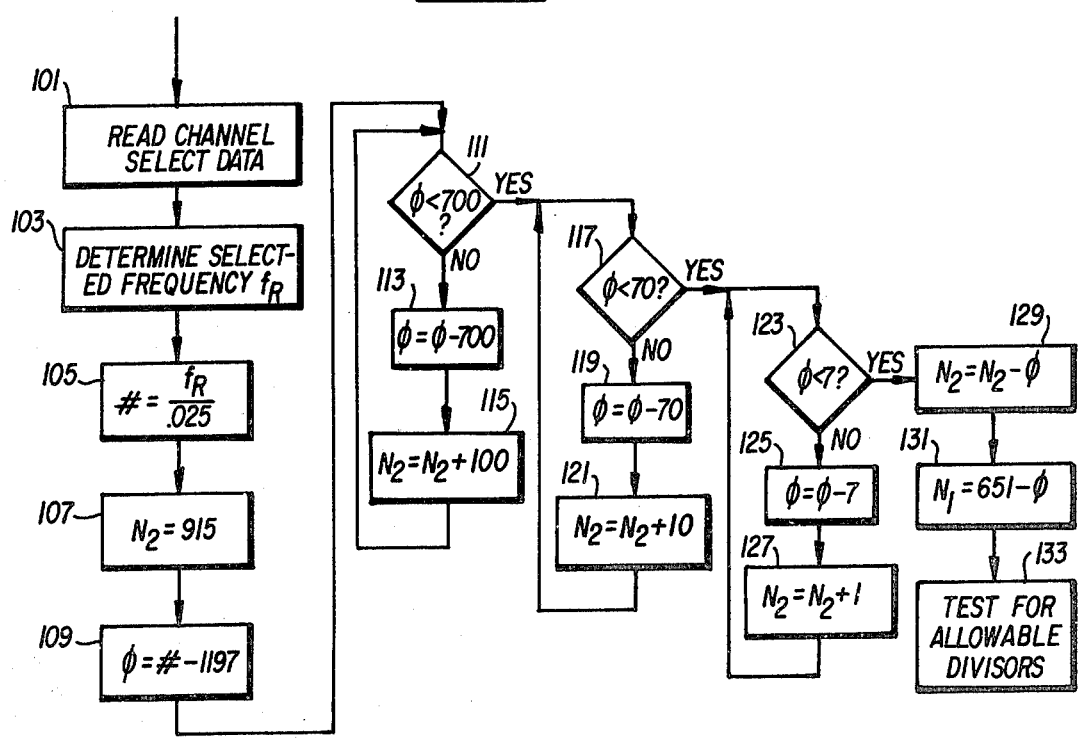
FIG. 4 illustrates an exemplary flow chart for programming the microprocessor of FIG. 3 to select suitable divider factors to generate a selected output frequency for a specific case of a synthesizer using the block diagram of FIG. 3.

FIG. 4 illustrates in flow chart form a program to enable microprocessor 67 to generate initial $N_1$ and $N_2$ divider factors for the programmable frequency dividers 45 and 55 in a frequency synthesizer. For the purposes of explanation, initial constants have been selected for a synthesizer designed to cover the range of 30.000–111.375 MHz in steps of 25 KHz, using the reference frequencies $f_1 = 200$ KHz and $f_2 = 175$ KHz. These reference frequencies can be derived from a common 1.4 MHz clock by division by 7($R_1$) and 8($R_2$) respectively. Initially, in Step 101, the microprocessor reads channel select data from channel selection device 69 and in Step 103, the microprocessor determines by a table look up operation the selected output frequency $f_R$. In Step 105, the microprocessor calculates a channel number (#) by dividing a selected output frequency by a factor representing channel spacing ($\Delta = f_1 - f_2$); converting the 25 KHz channel spacing used for illustrative purposes to MHz yields 0.025. In Step 107, a value for $N_2$ is initialized at 915, and in Step 109 an (offset) value is formed as $\phi = (\#) - 1197$. A nested counting technique is then utilized to determine the $N_1$ and $N_2$ divider factors. In a first loop, the value $\phi$ is checked in Step 111 to see whether it is less than 700. If it is, the process proceeds to the second nested loop; if not, $\phi$ is decremented by 700 in Step 113 and $N_2$ is incremented by 100 in Step 115, whereupon the first loop again checks in Step 111 for a $\phi$ value less than 700. This process is repeated until a yes condition is obtained in Step 111. In the second nested loop, $\phi$ is checked in Step 117 to see if it is less than 70. If not, $\phi$ is decremented by 70 in Step 119 and $N_2$ is incremented by 10 in Step 121. The process then repeats the second loop until a value less than 70 is encountered in Step 117, at which time the process proceeds to the third nested loop, wherein $\phi$ is checked to see whether it is less than 7 in Step 123. If not, $\phi$ is decremented by 7 in Step 125 and $N_2$ is incremented by 1 in Step 127. The third loop process is repeated until $\phi$ becomes less than 7. When $\phi$ is found to be less than 7 in Step 123, the process proceeds to calculate the initial $N_1$ and $N_2$ divider factors by calculating $N_2 = N_2 - \phi$ in Step 129 and $N_1 = 651 - \phi$ in Step 131. The $N_1$ and $N_2$ divider factors obtained, if fed to programmable frequency dividers 45 and 55, will cause a selected synthesized output frequency $f_R$ to exist at the output of VCO 39.

Although other programming processes could be used to calculate initial values for $N_1$ and $N_2$, the process illustrated in FIG. 4 is preferred because it is relatively fast and the speed with which an output frequency is produced by a synthesizer after selection thereof is important.

An example of the implementation of the FIG. 4 process using specific values will now be provided. Assume divider factors $N_1$ and $N_2$ must be calculated for a selected output synthesizer frequency of $f_R = 71.075$ MHz. This frequency value is determined in Steps 101 and 103 and the corresponding channel number (#) is calculated in Step 105 as (71.075 MHz/0.025) = 2843. From this, the offset value $\phi$ is calculated as $2843 - 1197 = 1646$ in Step 109. Proceeding to the first counting loop, 700 must be subtracted from $\phi$ twice in Step 113 for it to become less than 700. Thus, during execution of the first loop, $\phi$ becomes 246 and $N_2$, from two executions of Step 115, becomes $915 + 2(100) = 1115$. Proceeding to the second loop, $\phi$ must be decremented by 70 in Step 119 three times before it will assume a value less than 70. As a result of this loop, $\phi$ becomes 36 and $N_2$ becomes, from three executions of Step 121, $1115 + 3(10) = 1145$. Proceeding to the third loop, 7 must be subtracted from $\phi$ five times in Step 125 to produce a $\phi$ value less than 7. This provides a net result of $\phi = 1$, from five executions of Step 127, and $N_2 = 1145 + 5(1) = 1150$. The final calculation for the initial $N_1$ and $N_2$ divider factors then proceeds with $N_2 = 1150 - 1 = 1149$ in Step 129 and $N_1 = 651 - 1 = 650$ in Step 131. These initial divider factors, if fed to the programmable dividers 45 and 55, would cause the coupled loops to generate an output frequency of 71.075 MHz.

In accordance with the invention, the initially calculated $N_1$ and $N_2$ divider factors are tested in Step 133 of FIG. 4 against impermissible divider factors which are predetermined and stored in the microprocessor either as a calculation or a table of impermissible factors. If the initially determined $N_1$ and $N_2$ divider factors do not correspond to stored impermissible divider factors, they are applied by the microprocessor to the programmable frequency dividers 45 and 55. If the initially determined $N_1$ and $N_2$ divider factors do correspond (either one or both) to impermissible divider factors, new $N_1$ and $N_2$ divider factors are determined which will provide the same selected output frequency $f_R$. The new $N_1$ and $N_2$ divider factors are determined by incrementing (or decrementing) the initially determined $N_1$ and $N_2$ values by $kn$ and $k(n+1)$, where k is an integer and $n = (f_2/f_1 - f_2)$, as described above. Depending upon the environment of use, a single increment (k=1) will probably be sufficient to provide acceptable new divider factors $N_1$ and $N_2$ and the microprocessor may be instructed to use the new $N_1$ and $N_2$ divider factors without further testing them against impermissible divisors to control programmable dividers 45 and 55. However, in some cases it may be necessary to further test the new divider factors against the stored impermissible divider factors and further increment the newly determined divider factors if acceptable divider factors are still not produced.

Figure 5:
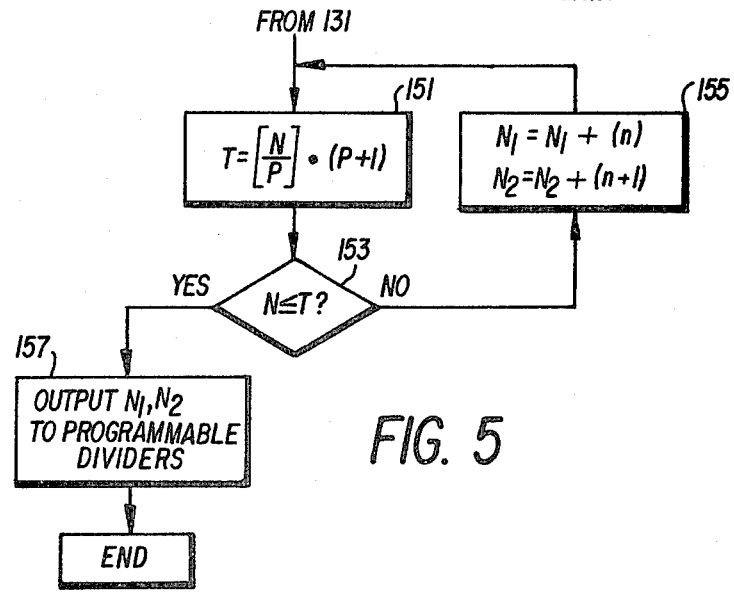
FIG. 5 illustrates a flow chart for programming the microprocessor to test selected divider factors for compliance with the capabilities of the programmable frequency dividers illustrated in FIG. 3.

FIG. 5 illustrates a simple process, implementing the allowable divisor test 133 of FIG. 4, for determining whether initially selected $N_1$ and $N_2$ divider factors are processable by programmable frequency dividers 45 and 55 using the variable modulus prescaler illustrated in FIG. 2. A determined test value T is calculated in Step 151 as $$T = [\frac{N}{P}] \cdot (P + 1),$$

where N is an initially determined divider factor ($N_1$ or $N_2$), P is a prescale factor used in a programmable frequency divider as described earlier in connection with FIG. 2, and $$[\frac{N}{P}]$$

represents truncation to an integer of the value N/P. The divider factor ($N_1$ or $N_2$) is tested in Step 153 against the test value T and if it is less than or equal to T, the divider factor is found permissible. If not, new divider factors must be calculated in Step 155 as one of the selected divider factors resides within the gap of impermissible divider factors for its associated programmable frequency divider. It should be understood that although FIG. 5 illustrates the test of a single divisor ($N_1$ or $N_2$), the same technique is repeated for the other divider factor so both are tested. In lieu of the FIG. 5 calculation process, a simple table loop up of impermissible divider factors by the microprocessor could also be used. In this case, initially determined $N_1$ and $N_2$ divider factors are compared with stored impermissible divider factors, that is, those which are not processable by the programmed dividers 45 and 55.

If an unallowed divider factor is identified, the two divider factors $N_1$ and $N_2$ can be incremented, or decremented, by $kn$ and $k(n+1)$, as described earlier, to avoid the non-allowed divisor gaps in the programmable frequency dividers. The incrementing technique is illustrated in FIG. 5 as Step 155 and can be performed without further testing of the new $N_1$ and $N_2$ divider factors if it is certain that they are processable by the programmed frequency dividers. However, a further testing of the new divider factors can also be performed, as indicated in FIG. 5.

When new divider factors are determined as acceptable, i.e., processable by the programmable frequency dividers, they are applied to the programmable frequency dividers by the microprocessor. FIG. 5 illustrates this as Step 157.

An example of an unallowed $N_2$ divider factor occurs in the illustrative synthesizer at an output frequency of 44.425 MHz. The initial $N_1$ and $N_2$ divider factors, as determined by the process shown in FIG. 4, are $N_1 = 645$ and $N_2 = 991$. The latter is an unallowed divider factor for a programmable divider using a $\div 32/33$ variable modulus prescaler, as determined by the process shown in FIG. 5 with $P = 32$. By using the divider factors $N_1 = 645 + 7 = 652$ and $N_2 = 991 + 8 = 999$, the same output frequency may be obtained with allowable divider factors.

The ability of the vernier synthesizer controller to perform this adaptive factor selection allows the use of larger prescale factors in the programmable dividers 45 and 55 than would otherwise be possible. The output from the prescaler is, as a consequence, at a lower frequency than it would be if a smaller prescale factor had to be used. This raises the maximum operating frequency of the loops, simplifies programmable counter logic, and reduces power dissipation.

After the initial $N_1$ and $N_2$ divider factors are calculated by the program of FIG. 4, they can also be tested against predetermined divider factors, stored in the microprocessor as calculations or in a table, which would produce undesirable frequencies within either of the loops. If an initially determined $N_1$ or $N_2$ divider factor matches a stored divider factor, then the divider factors $N_1$ and $N_2$ are respectively incremented or decremented by kn and k(n+1), as described earlier, to move the internal loop frequencies to acceptable values. A single increment ($k=1$) is generally sufficient.

Figure 6:
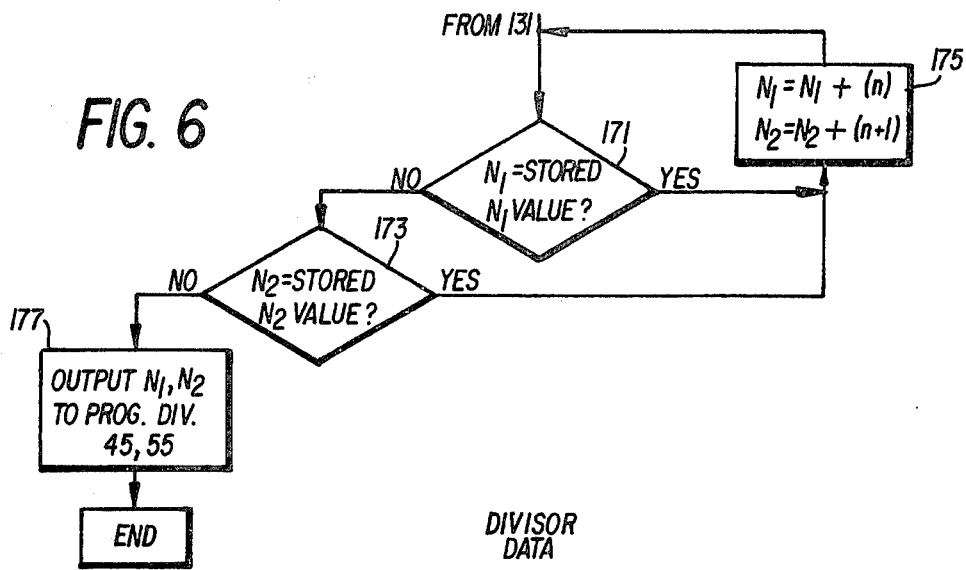
FIG. 6 illustrates a flow chart for programming the microprocessor of FIG. 3 to test selected divider factors against divider factors which would produce predetermined undesired loop operating characteristics.

FIG. 6 illustrates a microprocessor program for testing initially calculated divider factors $N_1$ or $N_2$ against stored impermissible $N_1$ and $N_2$ divider factors which would produce undesired frequency signals within the coupled phase lock loops, e.g., signals which might undesirably mix with other signals within or without the loops. The initially calculated $N_1$ and $N_2$ divider factors are respectively tested against stored $N_1$ and $N_2$ divider factors in Steps 171 and 173. If a correspondence is found in either test, the initially calculated $N_1$ and $N_2$ divider factors are incremented in Step 175 and the new values can be directly applied to the programmable frequency dividers 45 and 55 or again tested in Steps 171 and 173, as illustrated in FIG. 6. Whenever the tested divider factors $N_1$ and $N_2$ are not found in its storage, microprocessor 67 outputs these values to programmable frequency dividers 45 and 55 in Step 177. Of course, the program tests illustrated in FIGS. 5 and 6 could be sequentially carried out so the microprocessor first tests for processable divider factors (FIG. 5) and then tests for undesired loop operating conditions divider factors (FIG. 6).

An example of an operating condition in the illustrative synthesizer that results in an undesirable spurious mixing product occurs at an output frequency of $f_R = 43.275$ MHz. The normal divider factors are $N_1 = 649$ and $N_2 = 989$ which result in internal frequencies $f_{n1} = 129.800$ MHz and $f_{n2} = 173.075$ MHz. The spurious mixing product $Af_r + Bf_{n2} = f_s$, with A=3 and B=0, results in $f_s = 129.825$ and $\epsilon = 25$ KHz. This near coincidence can degrade the spectral purity of the synthesizer output. By changing the divider factors to $N_1 = 649 + 7 = 656$ and $N_2 = 989 + 8 = 997$, the internal frequencies are changed so that $\epsilon$ increases to 1.375 MHz and the problem is eliminated.

An example of an operating condition in the illustrative synthesizer that results in an internal signal that can interfere with external circuits occurs at an output frequency of 107.600 MHz. The normal divider factors are $N_1 = 645$ and $N_2 = 1352$ which results in $f_{n1} = 129.000$ MHz. If the synthesizer serves as the first local oscillator of a radio receiver that uses high side down conversion to a first intermediate frequency of 21.4 MHz, a potential difficulty exists because $f_{n1}$ is at the image frequency of the receiver. Extensive shielding may then be necessary to avoid interfering with the desired receiver signal at 86.200 MHz. By changing the divider factors to $N_1 = 645 + 7 = 652$ and $N_2 = 1352 + 8 = 1360$, the internal frequency $f_{n1}$ is changed to 130.400 MHz and the problem is eliminated.

Divisor selection programming will, of course, depend on the particular application in which the vernier frequency synthesizer is used. The microprocessor greatly facilitates adaptation of the synthesizer to various application requirements, as these requirements are easily programmed in the divisor selection criteria.

The divisor selection criteria programming could also be implemented to select divider factors $N_1$ and $N_2$ in accordance with other operating conditions within a loop. For example, divider factors can be selected such that one divider factor, e.g., $N_1$, varies over a narrow range (a minimum of (n+1) steps in one loop, thereby greatly simplifying the construction and operation of that loop. The VCO in that loop need only cover a narrow range and the loop would not need pretuning. Moreover, the variation in loop gain would be small and not require compensation and the programmable frequency divider hardware could also be simplified. Nearly constant deviation frequency or phase modulation could be applied to the narrow range loop.

Both loops may also be programmed, by suitable divider factor selection criteria, to vary widely and in opposite directions, in which case the output frequency range would be covered with minimal overall range for both loops. This approach may be optimum if there is no advantage to either loop operating in a narrow range.

Figure 7:
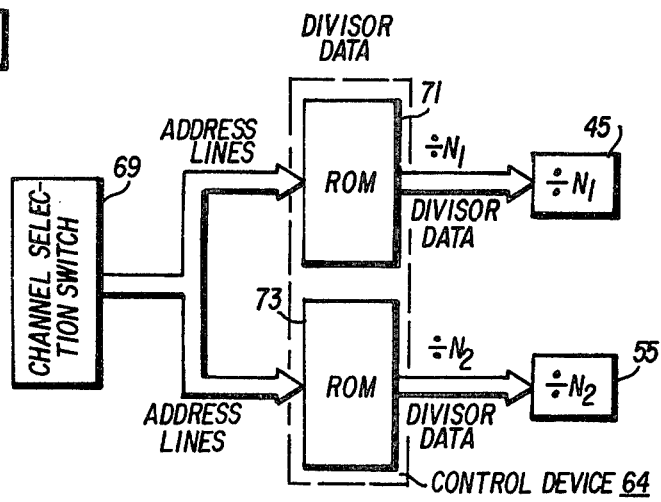
FIG. 7 illustrates a portion of another embodiment of the invention which uses preprogrammed memory devices as the control device.

Although the invention has been described with reference to a microprocessor for selecting divider factors, other electronic devices can be used to implement the control device. FIG. 7 illustrates an embodiment using read only memories (ROMS) 71 and 73 as the control device. In this embodiment, permissible $N_1$ and $N_2$ divider factors are predetermined and preprogrammed in ROM storage devices 71 and 73 for each possible selected frequency. Selection of a channel frequency by selection switch 69 causes divider factors $N_1$ and $N_2$ stored in address locations in respective memories 71 and 73 corresponding to the selected frequency to be read out and applied to programmable dividers 45 and 55. The $N_1$ and $N_2$ divider factors stored in ROMS 71 and 73 for each selected output frequency are selected to accommodate dividing gaps in programmable dividers 45 and 55, or to achieve predetermined loop operating characteristics, as discussed above. ROMS 71 and 73 may also be replaced by other addressable storage devices such as, for example, a diode matrix or plugboard.

Figure 8:
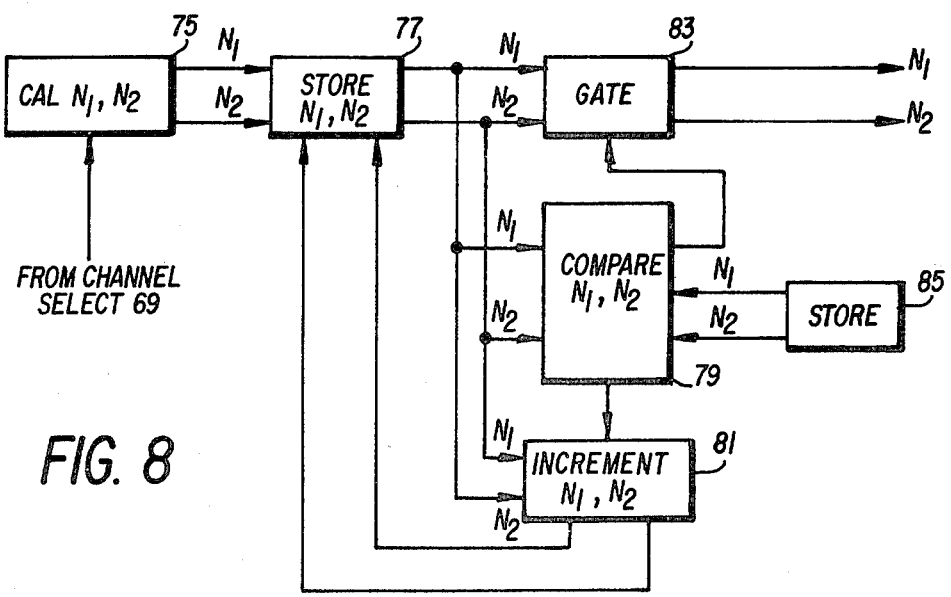
FIG. 8 illustrates a portion of another embodiment of the invention which uses logic devices as the control device.

The control device may also be implemented with other logic devices, although with greater complexity. FIG. 8 illustrates an embodiment of the invention using a calculating device 75 to provide initial $N_1$ and $N_2$ divider factors. Calculating device 75 calculates $$N_2 = \frac{(f_R + 129)}{f_2},$$

where $f_R$ is the synthesizer output frequency and $f_2$ is the reference frequency for the loop having the $N_2$ divider factor, i.e., 0.175 MHz in the exemplary synthesizer described above. The integer (i) and fractional (f) parts of $N_2$ are then separated and the calculation $N_2 = N_{2(i)} + 8 - (7 \cdot N_{2(f)})$ is performed to yield an initial N₂ divider factor. The N₁ divider factor is then determined from the equation $$N_1 = \frac{(N_2 \cdot f_1) - f_R}{f_2},$$

where f₁ is the reference frequency for the loop having the N₁ divider factor, i.e., 0.2 MHz in the examplary synthesizer described above. The initially determined N₁ and N₂ divider factors are then fed to a storage device 77 and from there to a comparison device 79 which compares the initially calculated N₁ and N₂ divider factors against impermissible N₁ and N₂ divider factors stored in storage device 85. A gate 83 is operated by comparison device 79 to feed the stored N₁ and N₂ divider factors to the respective programmable dividers 45 and 55 if no match is found. However, if a match is found by comparison device 79, the initially stored N₁ and N₂ divider factors are respectively incremented by n and (n+1) by incrementing device 81, as discussed above, stored in storage device 77, and rechecked by comparison device 79. This process is repeated by the apparatus disclosed until permissible N₁ and N₂ divider factors are found, in which case they are applied by gate 83 to programmable frequency dividers 45 and 55.

Although the invention has been described in connection with several exemplary embodiments, many modifications can be made thereto without departing from its spirit and scope. For example, other programmable frequency changing devices such as multipliers or mixers could be used in the coupled loops in place of the programmable dividers and different techniques could be used to generate initial N₁ and N₂ divider factors. Accordingly, the invention is not to be construed as limited by the disclosed embodiments, but is limited solely by the following claims.

I claim:

1. An apparatus for generating an output signal of a selected frequency comprising:
    means for generating first and second reference signals of different frequency;
    a signal mixer;
    a first phase lock loop frequency locked to said first reference signal for providing a first mixing signal to said mixer, said first phase lock loop including a first adjustable frequency changing device for changing the frequency of a signal within said first loop by an adjustable factor of N₁;
    a second phase lock loop frequency locked to said second reference signal for providing a second mixing signal to said mixer, said second phase lock loop including a second adjustable frequency changing device for changing the frequency of a signal within said second loop by an adjustable factor of N₂, said first and second phase lock loops controlling said mixer to provide an output signal having a frequency which is determined by said N₁ and N₂ factors;
    means for selecting a desired frequency for said output signal; and,
    a microprocessor responsive to said desired frequency selection means for determining N₁ and N₂ factors which will produce said desired frequency and for respectively applying determined N₁ and N₂ factors to said first and second frequency changing devices, said microprocessor preventing application of predetermined ones of the N₁ and N₂ factors, which could produce a selected desired frequency, to said first and second frequency changing devices.

2. An apparatus as in claim 1, wherein said microprocessor prevents selection of N₁ and N₂ factors which would generate said desired output frequency but which would cause generation of predetermined undesired frequency signals within said first and second phase lock loops.

3. An apparatus as in claims 1 or 2, wherein said microprocessor prevents selection of N₁ and N₂ factors which would generate said desired output frequency but which are not processable by said frequency changing devices.

4. An apparatus as in claim 3, wherein said microprocessor (a) calculates N₁ and N₂ factors for a selected output signal frequency and (b) determines whether one or both of said calculated N₁ and N₂ factors correspond to predetermined impermissible N₁ and N₂ factors, if one or both of said calculated N₁ and N₂ factors correspond to said predetermined impermissible N₁ and N₂ factors, said microprocessor repeats operations (a) and (b) until divider factors N₁ and N₂ are calculated which do not correspond to said predetermined impermissible N₁ and N₂ divider factors, said microprocessor applying calculated divider factors N₁ and N₂ which do not correspond to said predetermined impermissible divider factors N₁ and N₂ to said first and second frequency changing devices.

5. An apparatus as in claim 3, wherein said microprocessor calculates initial N₁ and N₂ factors for a selected output signal frequency and determines whether one or both of said initial N₁ and N₂ factors correspond to predetermined impermissible N₁ and N₂ factors, if one or both of said initial N₁ and N₂ factors correspond to predetermined impermissible N₁ and N₂ factors said microprocessor calculates new N₁ and N₂ factors for a selected output signal frequency and applies said new N₁ and N₂ factors to said first and second frequency changing devices, if said initial N₁ and N₂ factors do not correspond to predetermined impermissible N₁ and N₂ factors said microprocessor applies said initial N₁ and N₂ factors to said first and second frequency changing devices.

6. An apparatus as in claims 1 or 2, wherein said frequency changing devices are programmable frequency dividers.

7. An apparatus as in claim 6, wherein said programmable dividers contain variable modulus prescalers.

8. An apparatus for generating an output signal of a selected frequency comprising:
    means for generating first and second reference signals of different frequency;
    a signal mixer;
    a first phase lock loop frequency locked to said first reference signal for providing a first mixing signal to said mixer, said first phase lock loop including a first adjustable frequency changing device for changing the frequency of a signal within said first loop by an adjustable factor of N₁;
    a second phase lock loop frequency locked to said second reference signal for providing a second mixing signal to said mixer, said second phase lock loop including a second adjustable frequency changing device for changing the frequency of a signal within said second loop by an adjustable factor of N₂, said first and second phase lock loops controlling said mixer to provide an output signal having a frequency which is determined by said $N_1$ and $N_2$ factors;

means for selecting a desired frequency for said output signal; and, control means responsive to said means for selecting for providing $N_1$ and $N_2$ factors to said first and second frequency changing devices to obtain said desired frequency, said control means selecting $N_1$ and $N_2$ factors which provide said desired frequency and preventing selection of $N_1$ and $N_2$ factors which would generate said desired frequency but which (a) are not processable by said first and second frequency changing devices or (b) would cause the generation of predetermined undesired frequency signals within said first and second phase lock loops.

9. An apparatus as in claim 8, wherein said control means comprises a memory storage device having permissible factors of $N_1$ and $N_2$ stored therein for each possible selected frequency for said output signal.

10. An apparatus as in claims 2 or 8, wherein said predetermined undesired frequencies are frequencies which cause spurious interference with other signals.

11. An apparatus as in claim 10, wherein said spurious interference is in the form of mixing products.

12. An apparatus as in claim 8, wherein said control means comprises:

means for selecting a set of $N_1$ and $N_2$ factors capable of causing generating of a said output signal at said selected frequency;

means for storing impermissible $N_1$ and $N_2$ factors;

means for applying a selected set of $N_1$ and $N_2$ factors to said first and second frequency changing devices if selected $N_1$ and $N_2$ factors do not correspond to one of said stored impermissible $N_1$ and $N_2$ factors; and, means for selecting and applying to said frequency changing devices a new set of $N_1$ and $N_2$ factors capable of causing generation of said output signal at said output frequency if previously selected $N_1$ and $N_2$ factors correspond to one of said stored impermissible $N_1$ and $N_2$ factors.

13. A method for generating an output signal of a selected frequency comprising the steps of:

generating first and second reference signals of different frequency;

locking a first phase locked loop onto said first reference signal, said phase lock loop having a first adjustable frequency changing device for changing a loop frequency by a factor $N_1$;

locking a second phase locked loop onto said second reference signal, said second phase lock loop having a second adjustable frequency changing device for changing a loop frequency by a factor of $N_2$;

mixing signals from said first and second phase lock loops to control generation of an output signal at a frequency determined by said $N_1$ and $N_2$ factors;

presetting a control device with information for selecting $N_1$ and $N_2$ values to generate said output signal at selected desired frequencies, said information preventing selection of certain $N_1$ and $N_2$ values which could produce said selected desired frequencies but which would generate predetermined undesired frequencies within said loops;

selecting a desired frequency for said output signal;

operating said control device in response to a selected frequency to select $N_1$ and $N_2$ factors and apply them to said first and second frequency changing devices to produce said selected desired frequency in said output signal.

14. A method for generating an output signal of a selected frequency comprising the steps of:

generating first and second reference signals of different frequency;

locking a first phase locked loop onto said first reference signal, said first phase lock loop having a first adjustable frequency changing device for changing a loop frequency by a factor $N_1$;

locking a second phase locked loop onto said second reference signal, said second phase lock loop having a second adjustable frequency changing device for changing a loop frequency by a factor $N_2$;

mixing signals from said first and second phase lock loops to control generation of an output signal at a frequency determined by said $N_1$ and $N_2$ factors;

presetting a microprocessor with a program for selecting $N_1$ and $N_2$ factors to generate said output signal at selected desired frequencies and for preventing selection of predetermined impermissible $N_1$ and $N_2$ factors which could produce said selected desired frequencies;

selecting a desired frequency for said output signal;

operating said microprocessor in response to a selected frequency in accordance with said program to select $N_1$ and $N_2$ factors and apply them to said first and second frequency changing devices to produce said selected desired frequency in said output signal by (a) calculating $N_1$ and $N_2$ values and (b) determining if one or both of said calculated $N_1$ and $N_2$ factors corresponds to predetermined impermissible $N_1$ and $N_2$ factors, if one or both of said calculated $N_1$ and $N_2$ factors correspond to predetermined impermissible $N_1$ and $N_2$ factors, (c) repeating operations (a) and (b) until calculated $N_1$ and $N_2$ factors do not correspond to said predetermined impermissible $N_1$ and $N_2$ factors and (d) applying calculated $N_1$ and $N_2$ factors which do not correspond to said predetermined impermissible $N_1$ and $N_2$ factors to said first and second frequency changing devices.

* * * * *